United States Patent
Kurosaki et al.

(10) Patent No.: US 10,115,879 B2
(45) Date of Patent: Oct. 30, 2018

(54) THERMOELECTRIC CONVERSION MATERIAL AND METHOD OF PRODUCTION THEREOF

(71) Applicant: Panasonic Corporation, Osaka (JP)

(72) Inventors: Ken Kurosaki, Osaka (JP); Shinsuke Yamanaka, Hyogo (JP); Yusufu Aikebaier, Fukui (JP); Seongho Choi, Osaka (JP); Junya Tanaka, Osaka (JP); Satoshi Maeshima, Kyoto (JP)

(73) Assignee: Panasonic Corporation, Osaka (JP)

( * ) Notice: Subject to any disclaimer, the term of this patent is extended or adjusted under 35 U.S.C. 154(b) by 7 days.

(21) Appl. No.: 15/417,284

(22) Filed: Jan. 27, 2017

(65) Prior Publication Data

US 2017/0263839 A1 Sep. 14, 2017

(30) Foreign Application Priority Data

Mar. 14, 2016 (JP) .................. 2016-049604

(51) Int. Cl.
*H01L 35/16* (2006.01)
*H01L 35/34* (2006.01)
(Continued)

(52) U.S. Cl.
CPC .............. *H01L 35/16* (2013.01); *C22C 12/00* (2013.01); *H01L 35/18* (2013.01); *H01L 35/34* (2013.01)

(58) Field of Classification Search
CPC ......... H01L 35/16; H01L 35/18; H01L 35/34; C22C 12/00
(Continued)

(56) References Cited

U.S. PATENT DOCUMENTS

| 2010/0294326 A1 | 11/2010 | Guo et al. |
| 2013/0323110 A1 | 12/2013 | Backhaus-Ricoult et al. |
| 2015/0200346 A1 | 7/2015 | Matsubara et al. |

FOREIGN PATENT DOCUMENTS

| JP | 2007-005544 | 1/2007 |
| JP | 2013-541639 A | 11/2013 |

(Continued)

OTHER PUBLICATIONS

Meng et al., Enhanced Thermoelectric Performance of p-type filled skutteruites via the coherency strain fields from spinodal decomposition, Acta Materialia, vol./issue 98, pp. 405-415 (2015). (Year: 2015).*

(Continued)

*Primary Examiner* — Jayne L Mershon
(74) *Attorney, Agent, or Firm* — Panasonic IP Management

(57) ABSTRACT

Provided herein is a skutterudite-type material having high thermoelectric conversion characteristics in a high temperature region. A thermoelectric conversion material is provided that contains a skutterudite-type material represented by the following composition formula (I)

$$I_xGa_yM_4Pn_{12} \qquad (I),$$

wherein x and y satisfy $0.04 \le x \le 0.11$, $0.11 \le y \le 0.34$, and $x<y$, I represents one or more elements selected from the group consisting of In, Yb, Eu, Ce, La, Nd, Ba, and Sr, M represents one or more elements selected from the group consisting of Co, Rh, Ir, Fe, Ni, Pt, Pd, Ru, and Os, and Pn represents one or more elements selected from the group consisting of Sb, As, P, Te, Sn, Bi, Ge, Se, and Si.

6 Claims, 8 Drawing Sheets

(51) Int. Cl.
  *C22C 12/00* (2006.01)
  *H01L 35/18* (2006.01)
(58) Field of Classification Search
  USPC .......................................................... 136/236
  See application file for complete search history.

(56) References Cited

FOREIGN PATENT DOCUMENTS

JP  2014-195080 A  10/2014
JP  2015-156476 A  8/2015

OTHER PUBLICATIONS

Shi et al. Band Structure Engineering and Thermoelectric Properties of Charge-Compensated Filled Skutterudites, Scientific Reports, pp. 1-11 (2015). (Year: 2015).*

Choi et al., Enhanced Thermoeelctric Properties of Ga and In Co-added CoSb3-based Skutterudites with optimized chemical composition and Microstructure, AIP Advances, vol. 6, pp. 125015-1 through 125015-9, (2016). (Year: 2016).*

Qiu et al., Electrical Properties and Microcosmic Study on Compound Defects in Ga-containing Thermoeelctric Skutterudites, Journal of Materials Chemistry, vol./Issue 2, pp. 10952-10959 (2014). (Year: 2015).*

Xi et al., Defect-enhanced void filling and novel filled phase of open-structure skutterudites, Chem. Commun., The Royal Society of Chemistry, vol./issue 51, pp. 10823-108266 (Year: 2015).*

Xiaoya Shi et al., "Band Structure Engineering and Thermoelectric Properties of Charg-Compensated Filled Skutterudited", Scientific Reports, GB, 2015.

Seongho Choi et al., "Enhancement of thermoelectric properties of CoS b3 skutterudite by addition of Ga and In", Japanese Journal of Applied Physics, Japan, 2015, vol. 54, 111801.

* cited by examiner

THERMOELECTRIC CONVERSION MATERIAL AND METHOD OF PRODUCTION THEREOF

TECHNICAL FIELD

The technical field relates to a thermoelectric conversion material, and a method of production thereof.

BACKGROUND

Thermoelectric conversion materials, and thermoelectric conversion modules using thermoelectric conversion materials have been used as devices for converting heat into electricity and vice versa for cooling and electricity generation. For example, passing a direct current through a thermoelectric conversion material brings about transfer of heat from one surface to the other, and creates an endothermic surface and an exothermic surface. This phenomenon is known as the Peltier effect. By bringing the endothermic surface of a module prepared from a thermoelectric conversion material into contact with an object to be cooled, the Peltier effect allows cooling the object without requiring moving parts. On the other hand, applying a temperature difference across a thermoelectric conversion material creates a proportional electromotive force. This phenomenon is known as the Seebeck effect, which allows conversion of heat energy into electrical energy when one side of a module is cooled by air cooling or water cooling while the other side is in contact with an object dissipating excess heat energy. Specifically, the Seebeck effect allows for recovery of waste energy. Such thermoelectric conversion modules using the Seebeck effect have attracted interest as an electricity generating device, and use of thermoelectric conversion modules in such novel applications has been actively studied.

Bismuth-tellurium-based materials are the most well known example of materials that effectively produce the thermoelectric conversion phenomenon. Modules using bismuth-tellurium-based materials have been put to practical applications in cooling applications based on the Peltier effect, and in other applications, including temperature modulation of a laser diode for optical communications. There have been studies to use bismuth-tellurium-based-materials also for electricity generation. However, use of bismuth-tellurium-based materials in such applications is limited because of the temperature dependence of the electricity generating efficiency of thermoelectric conversion materials (bismuth-tellurium-based materials).

This is described below in more detail. One of the physical properties representing the characteristics of a thermoelectric conversion material is the Seebeck coefficient S (unit: V/K). This value, measured in volts per unit temperature difference, represents the magnitude of the electromotive force due to a temperature difference. The Seebeck coefficient takes a positive or a negative value, depending on the thermoelectric conversion material. This is determined by whether the carriers in the thermoelectric conversion material are holes or electrons. The notation, P-type or N-type, is typically used for positive and negative Seebeck coefficients, respectively. Electrical resistivity $\rho$ (unit: $\Omega \cdot m$) is another physical property representing the characteristics of a thermoelectric conversion material. The generated electromotive force by the Seebeck effect produces a current that flows through a thermoelectric conversion material. However, the power that can be extracted for electricity generation is proportional to the product of the generated voltage and current. In other words, more power can be extracted when the electrical resistivity is low. Specifically, the foregoing two physical properties directly determine the electricity generating capability of a thermoelectric conversion material, and these are represented by a power factor PF (unit: $W/mK^2$; hereinafter, also referred to simply as "PF") calculated according to the following formula (1).

$$PF = \frac{S^2}{\rho} \tag{1}$$

Thermal conductivity $\kappa$ (unit: $W/m \cdot K$) also represents the characteristics of a thermoelectric conversion material, though this is not a physical property that directly affects generation of electricity. In producing the Seebeck effect with a given amount of heat energy, a temperature difference does not easily occur in the material when the thermal conductivity of the thermoelectric conversion material is excessively large. Materials with scalier thermal conductivities thus allow for larger temperature, differences, and, in turn, larger amounts of electricity. The dimensionless performance index ZT combines the Seebeck coefficient S, the electrical resistivity $\rho$, and the thermal conductivity $\kappa$, as represented by the following formula (2).

$$ZT = \frac{S^2}{\rho \cdot \kappa} \times T \tag{2}$$

The dimensionless performance index ZT involves absolute temperature T (K) because the variables in the equation have temperature dependence. ZT is used as an index of thermoelectric conversion performance, not the amount of generated electricity itself, which is represented by PF, as described above. In other words, while ZT may take large values when the thermal conductivity is excessively small, the amount of generated electricity does not increase unless it is simultaneously accompanied by a large PF value.

FIG. 8 represents the PF of a bismuth-tellurium-based material as a function of temperature. As shown in FIG. 8, the highest PF value occurs in the vicinity of ordinary temperature in a bismuth-tellurium-based material, and the PF value has a tendency to decrease with increase in temperature.

A large temperature difference is needed to obtain large electricity with a thermoelectric conversion material. There are attempts for effective use of electricity converted from discharge heat of about 300° C. from engines and turbines of, for example, factories and automobiles. However, attempts to generate more electricity by making a large temperature difference, in a bismuth-tellurium-based material actually result in producing small PF values with increase in temperature, as shown in FIG. 8. Indeed, such temperature dependence has made it difficult to increase an amount of generated electricity, and there is a need for studies of a novel material.

JP-A-2007-5544 related to a thermoelectric-conversion material describes a cobalt-antimony-based material having high performance in a high temperature region as an alternative material of bismuth-tellurium-based materials. The cobalt-antimony-based material has a crystalline structure called a skutterudite structure. The composition formula is $Co_4Sb_{12}$, and the material has relatively large spaces inside the crystal lattice. $Co_4Sb_{12}$ itself is an N-type material, and has a desirable Seebeck coefficient. However, this material has a high electrical resistivity of, for example, about $1\times10^{-4}$ $\Omega \cdot m$ at ordinary temperature, and a high thermal conductivity of about 10 W/mK at ordinary temperature. Accordingly, PF and ZT are both low. It is known that adding other elements to $Co_4Sb_{12}$ improves the thermoelectric conversion characteristics, as described in JP-A-2007-5544. For example, both the electrical resistivity and the thermal conductivity can be reduced by adding Yb (ytterbium). It is also known chat thermal conductivity becomes effectively smaller in the presence of other elements, and this effect known as the rattling effect. The rattling effect occurs as the added Yb enters the spaces in the $Co_4Sb_{12}$ skeleton, which causes thermal oscillation independently from $Co_4Sb_{12}$, and reduces a phonon (lattice oscillation) in the $Co_4Sb_{12}$ skeleton.

However, the thermoelectric conversion material of the composition described in JP-A-2007-5544 is not sufficient for practical applications, and requires further improvement of thermoelectric characteristics.

SUMMARY

Under these circumstances, one of the objects of the present disclosure is intended to provide a thermoelectric conversion material containing a skutterudite-type material that provides desirable thermoelectric conversion characteristics.

In order to achieve the foregoing object, the present disclosure provides a thermoelectric conversion material that includes a skutterudite-type material represented by the following composition formula (I).

$$I_xGa_yM_4Pn_{12} \qquad (I),$$

wherein:

x and y satisfy the formulae $0.04 \leq x \leq 0.11$, $0.11 \leq y \leq 0.34$, and $x < y$, I represents one or more elements selected from a group of elements including; In, Yb, Eu, Ce, La, Nd, Ba, and Sr, M represents one or more elements selected from a group of elements including: Co, Rh, Ir, Fe, Ni, Pt, Pd, Ru, and Os, and Pn represents one or more elements selected from a group of elements including: Sb, As, P, Te, Sn, Bi, Ge, Se, and Si.

The present disclose enables providing a thermoelectric conversion material having desirable thermoelectric characteristics.

DETAILED DESCRIPTION OF PREFERRED EMBODIMENTS

Figure 1:
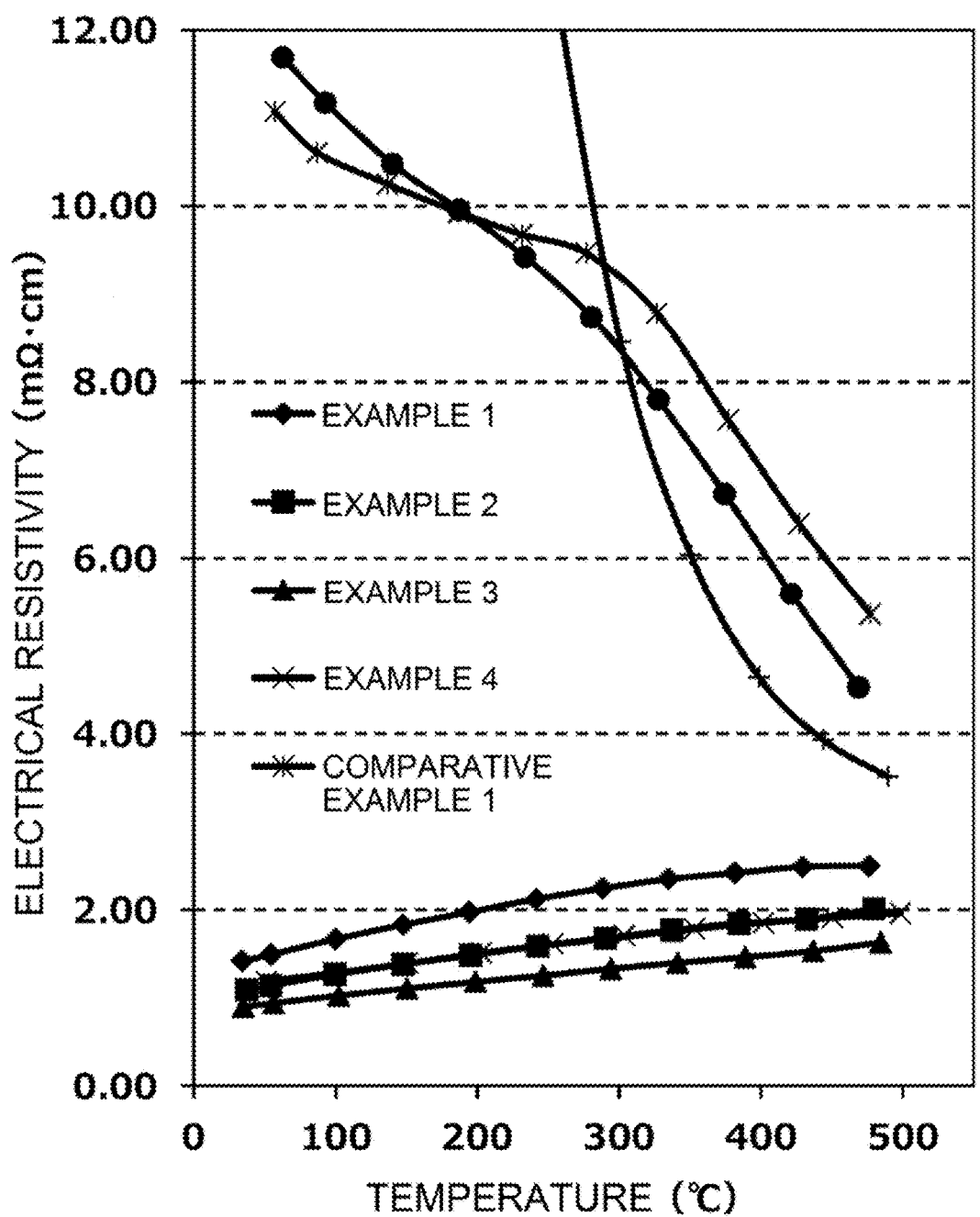
FIG. 1 is a diagram representing the electrical resistivity of skutterudite-type materials as a function of temperature according to an embodiment of the present disclosure.

An illustrative embodiment of the present disclosure is described below with reference to the accompanying drawings.

Thermoelectric Conversion Material

An embodiment of the present disclosure relates to a thermoelectric conversion material containing a skutterudite-type material. The skutterudite-type material is a cubical crystal solid solution of a composition represented by $M_4Pn_{12}$, where M is an element in Group VIII of the periodic table, and Pn is an element in group IVB, VB, or VIB of the periodic table. Examples of the elements represented by M include Co, Rh, Ir, Fe, Ni, Pt, Pd, Ru, and Os. Examples of the elements represented by Pn include Sb, As, P, Te, Sn, Bi, Ge, Se, and Si.

The crystal lattice of the skutterudite-type material has one empty lattice per $M_4Pn_{12}$. All of or some of the empty lattices may be filled with rare earth elements such as La, Ce, and Yb, alkali earth elements such as Ba, and Ca, or earth, metal elements such as Tl, In, and Sn. A material filled with these elements has a composition represented by $L_xM_4Pn_{12}$ (where $L_x$ is the element introduced to the empty lattice, and $0 < x \leq 1$), and is called a filled skutterudite-type material.

The material contained in the thermoelectric conversion material of the embodiment of the present disclosure is of a filled skutterudite type, and has a structure in which two elements are added in combination. Specifically, the material is a double filled skutterudite-type material. As used, herein, "skutterudite-type material" encompasses a filled skutterudite-type material (including a double filled skutterudite-type material).

Specifically, the thermoelectric conversion material of the embodiment of the present disclosure contains a double filled skutterudite-type material represented by the following composition formula (I).

$$I_xGa_yM_4Pn_{12} \qquad (I)$$

In the composition formula (I), x satisfies $0.04 \leq x \leq 0.11$, preferably $0.09 \leq x \leq 0.11$. The subscript y satisfies $0.11 \leq y \leq 0.34$, preferably $0.26 \leq y \leq 0.34$. Here, $x < y$. By satisfying these ranges, it is possible to achieve desirable performance as expected from, the power factor (PF) indicative of thermoelectric conversion performance, as will be described later in Examples 1 to 4. A more desirable thermoelectric conversion material can be obtained when x and y in the composition formula (I) satisfy the ranges of Examples 3 and 4 of higher PF values.

In the composition formula (I), I represents one or more elements selected from the group consisting of In, Yb, Eu, Ce, La, Nd, Ba, and Sr. M represents one or more elements selected from the group consisting of Co, Rh, Ir, Fe, Ni, Pt, Pd, Ru, and Os. Pn represents one or more elements selected from the group consisting of Sb, As, P, Te, Sn, Si, Ge, Se, and Si.

Note, however, that M is preferably Co, and Pn is preferably Sb from the standpoint of, for example, thermoelectric conversion performance. It is particularly preferable from the standpoint of stable material quality that the skutterudite-type material is double filled with In and Ga. Specifically, it is particularly preferable that the skutterudite-type material is $Co_4Sb_{12}$ with the added elements Ga and In, specifically $In_zGa_yCo_4Sb_{12}$. Typically, the skutterudite-type material is filled with rare earth elements (such as Yb, Ce, and La). However, these are difficult to handle as they undergo rapid oxidation even at ordinary temperature, and require storage in oil. It is therefore preferable for stable material quality that the skutterudite-type material be double filled with In.

The following describes a skutterudite-type material containing a thermoelectric conversion material according to the embodiment of the present disclosure in which the elements represented by I, M, and Pn are In, Co, and Sb, respectively, in the composition formula (I). However, the skutterudite-type material of the present disclosure is not limited to the material containing these elements.

The skutterudite-type material according to the embodiment of the present disclosure is one obtained by adding a combination of In and Ga to the common skutterudite-type material $Co_4Sb_{12}$. The material of the embodiment is represented by the composition formula $In_xGa_yCo_4Sb_{12}$ (II), where x is a variable between 0.4 and 0.11, and y is a variable between 0.11 and 0.34. Here, x and y are adjusted to satisfy x<y.

The skutterudite-type material of the embodiment of the present disclosure is described below using the materials (Examples 1 to 4) represented by the following composition formula.

Example 1: $In_{0.04}Ga_{0.11}Co_4Sb_{12}$
Example 2: $In_{0.06}Ga_{0.10}Co_4Sb_{12}$
Example 3: $In_{0.09}Ga_{0.20}Co_4Sb_{12}$
Example 4: $In_{0.11}Ga_{0.34}Co_4Sb_{12}$ These materials were compared to a material (Comparative Example 1) that does not contain In or Ga, a material (Comparative Example 2) of the composition $Co_4Sb_{12}$ with only one additional element Ga, and a material (Comparative Example 3) of the composition $Co_4Sb_{12}$ with additional elements In and Ga and in which x and y in the composition formula do not satisfy the foregoing ranges.

Figure 2:
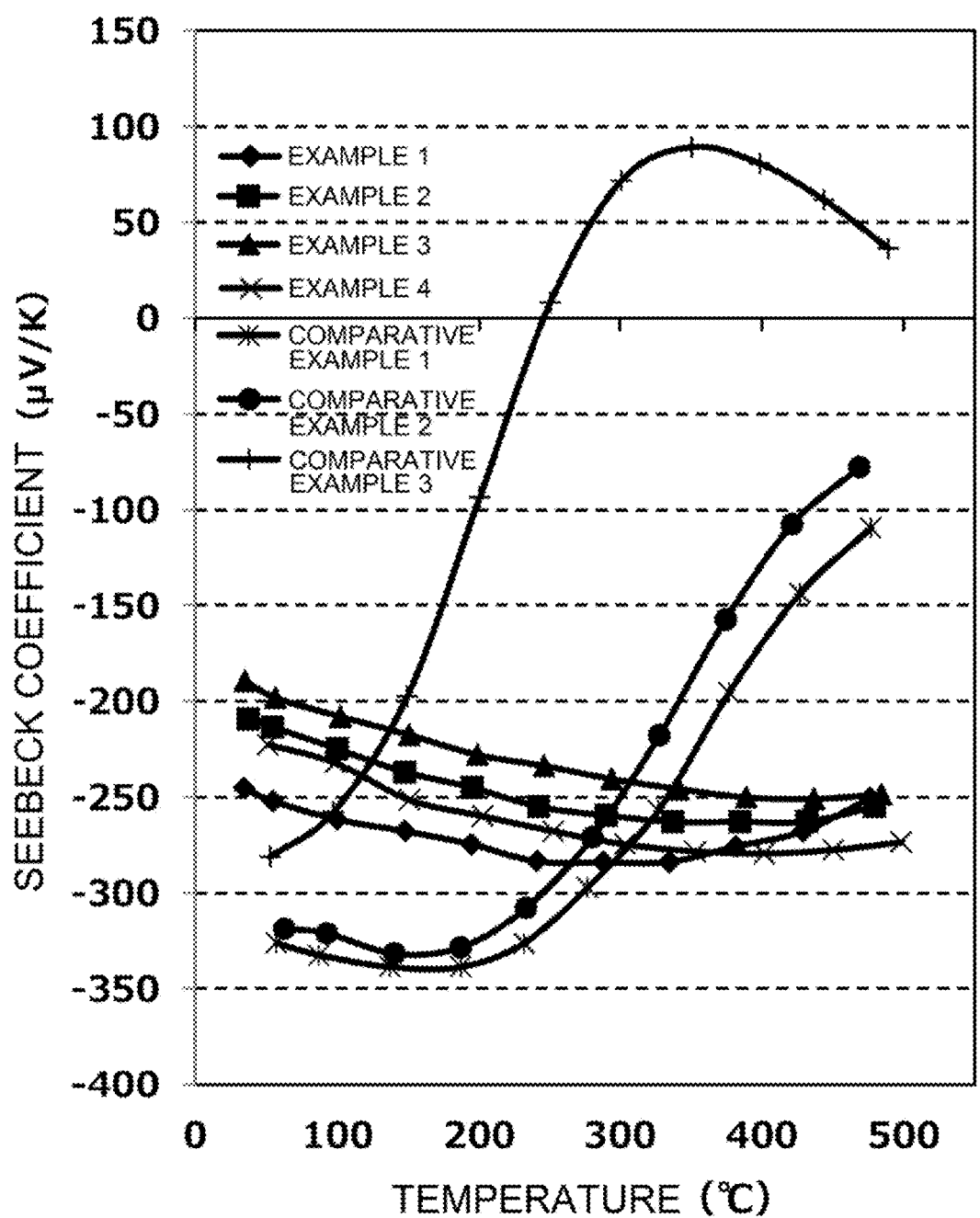
FIG. 2 is a diagram representing the Seebeck coefficient of skutterudite-type materials as a function of temperature according to an embodiment of the present disclosure.
Figure 3:
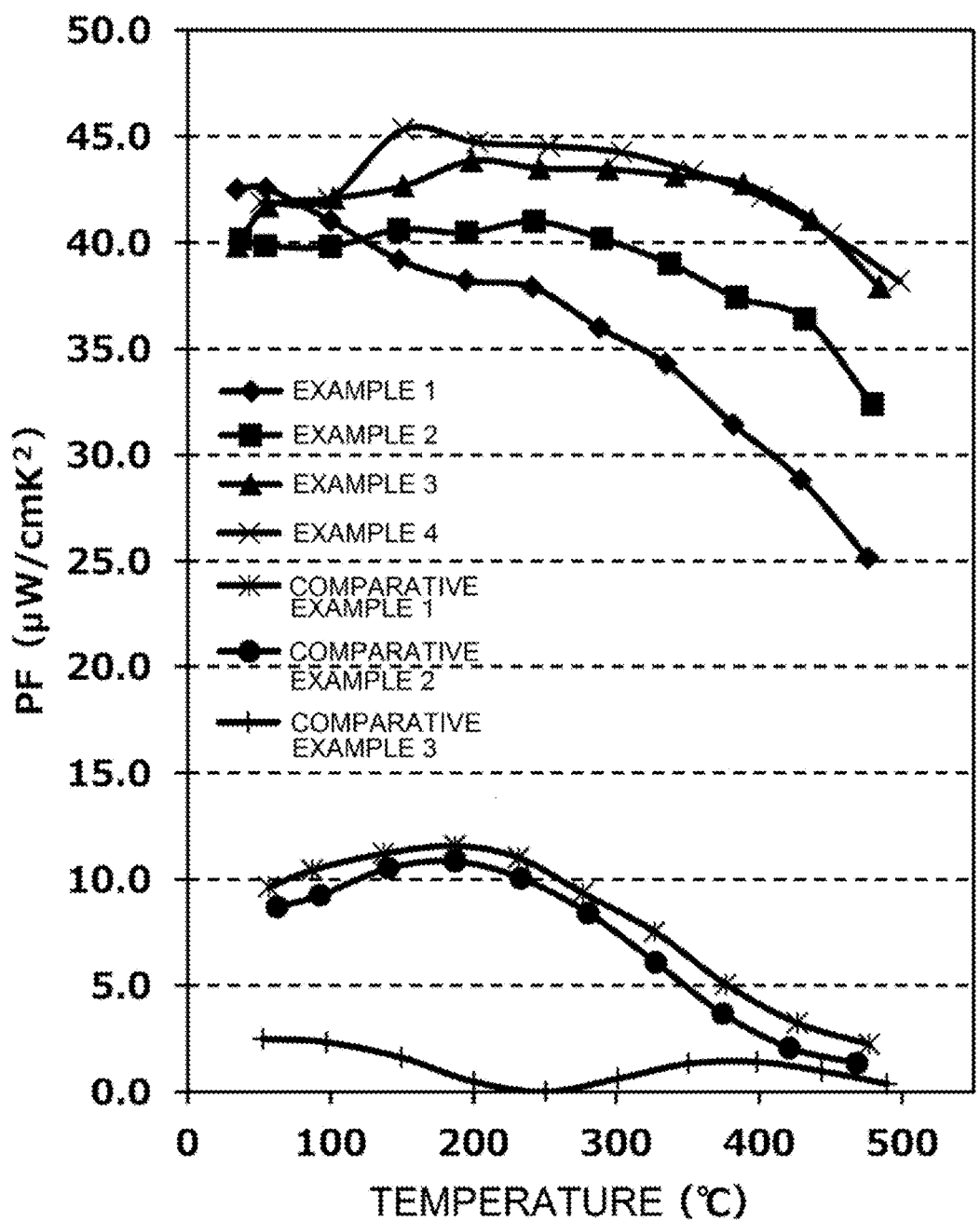
FIG. 3 is a diagram, representing the PF of skutterudite-type materials as a function of temperature according to an embodiment of the present disclosure.

Comparative Example 1: $Co_4Sb_{12}$
Comparative Example 2: $Ga_{0.2}Co_3Sb_{12}$
Comparative Example 3: $In_{0.01}Ga_{0.04}Co_4Sb_{12}$ The materials of the foregoing composition formulae of Examples 1 to 4 and Comparative Examples 1 to 3 were measured for Seebeck function S, electrical resistivity ρ, and thermal conductivity κ in a temperature range of from room temperature to 500° C. The Seebeck coefficient S and the electrical resistivity ρ were measured with the ULVAC product ZEM3. The thermal conductivity κ was measured according to a laser flash method using the ULVAC product TC-700. FIG. 1 is a graph representing the electrical resistivity ρ of the materials represented by the composition formulae of Examples 1 to 4 and Comparative Examples 1 to 3 as a function of temperature. FIG. 2 is a graph representing Seebeck coefficient S as a function of temperature. FIG. 3 is a graph representing power factor PF as a function of temperature. The power factor PF is a value ($W/mK^2$) calculated from, the Seebeck coefficient S and the electrical resistivity ρ according to the following formula (1), as described above.

$$PF = \frac{S^2}{\rho} \tag{1}$$

The electrical resistivity is described first, with reference to FIG. 1. In the graph of FIG. 1, the horizontal axis represents the atmospheric temperature (° C.) of an environment corresponding to the operating temperature environment of the module. The vertical axis represents electrical resistivity (mΩ·cm). As shown in FIG. 1, electrical resistivity changes against temperature show greatly different patterns between the materials of Comparative Examples 1 to 3 and the materials of Examples 1 to 4. Specifically, the materials of Examples 1 to 4 show lower electrical resistivity values than the materials of Comparative Examples 1 to 3 throughout the temperature range, and are useful as thermoelectric conversion materials.

By focusing on the relation between temperature and electrical resistivity shown in FIG. 1, the electrical resistivity decreased with increasing temperatures, and a semiconductor-like behavior was observed in Comparative Examples 1 to 3. In contrast, the materials of Examples 1 to 4 showed a metal-like behavior by increasing their electrical resistivity with increase in temperature. This is believed to be an effect due to the addition of In and Ga. In and Ga enter the spaces inside the skutterudite structure, and electrically bind to the skeleton $Co_4Sb_{12}$, though the bond is weak. The elements In and Ga thus act as electron donors, and the carrier concentration increases in the material. Specifically, the materials of Examples 1 to 4 with sufficient amounts of In and Ga show lower electrical resistivity than the material of Comparative Example 1 that does not contain In or Ga. A high electrical resistivity occurs as in Comparative Example 1 when In is not contained, even when Ga is contained to some extent as in the material of Comparative Example 2. This is believed to be due to the different effects of In and Ga. Ga fills the spaces inside the skutterudite structure in smaller amounts than In, and donates smaller number of electrons than In. Some of the Ga atoms are also replaced by Sb in the skutterudite structure. Ga also has fewer valence electrons than Sb, and the carrier concentration decreases when Ga is replaced by Sb. Specifically, the electron donating effect and the reducing effect occur together, and the carrier concentration does not change greatly when Ga is added alone. The effect of Ga on electrical resistivity is thus smaller than that of In. Accordingly, the electrical resistivity is higher in Comparative Example 2, in which In was not added, than in Examples 1 to 4.

The Seebeck coefficient S is described below with reference to FIG. 2. In the graph of FIG. 2, the horizontal axis represents the measurement atmosphere temperature (° C.), and the vertical axis represents the Seebeck coefficient (μV/K). As shown in FIG. 2, the Seebeck coefficient snows greatly changing patterns between the materials of Comparative Examples 1 to 3 and the materials of Examples 1 to 4, as does electrical resistivity. This also appears to be the result of adding In and Ga, and the effect of the carrier electrons. As shown in FIG. 2, the materials of Examples 1 to 4 have relatively smaller temperature dependence, and show stable Seebeck coefficient values throughout the temperature range. These materials also have higher absolute values than the materials of Comparative Examples 1 to 3 in a 300° C. to 500° C. region, and show more desirable Seebeck coefficients. This makes the materials of Examples 1 to 4 suitable for use at high temperatures (300° C. to 500° C.).

The power factor is described below with reference to FIG. 3. In the graph of FIG. 3, the horizontal axis represents the measurement atmosphere temperature (° C.), and the vertical axis represents PF ($\mu W/cm^2$). As shown in FIG. 3, the materials of Examples 1 to 4 show high power factors throughout the temperature range. Because the power factor directly represents the amount of generated electricity, the thermoelectric characteristics are clearly more desirable in the materials of Examples 1 to 4 than in the materials of Comparative Examples 1 to 3 throughout the temperature range.

Figure 8:
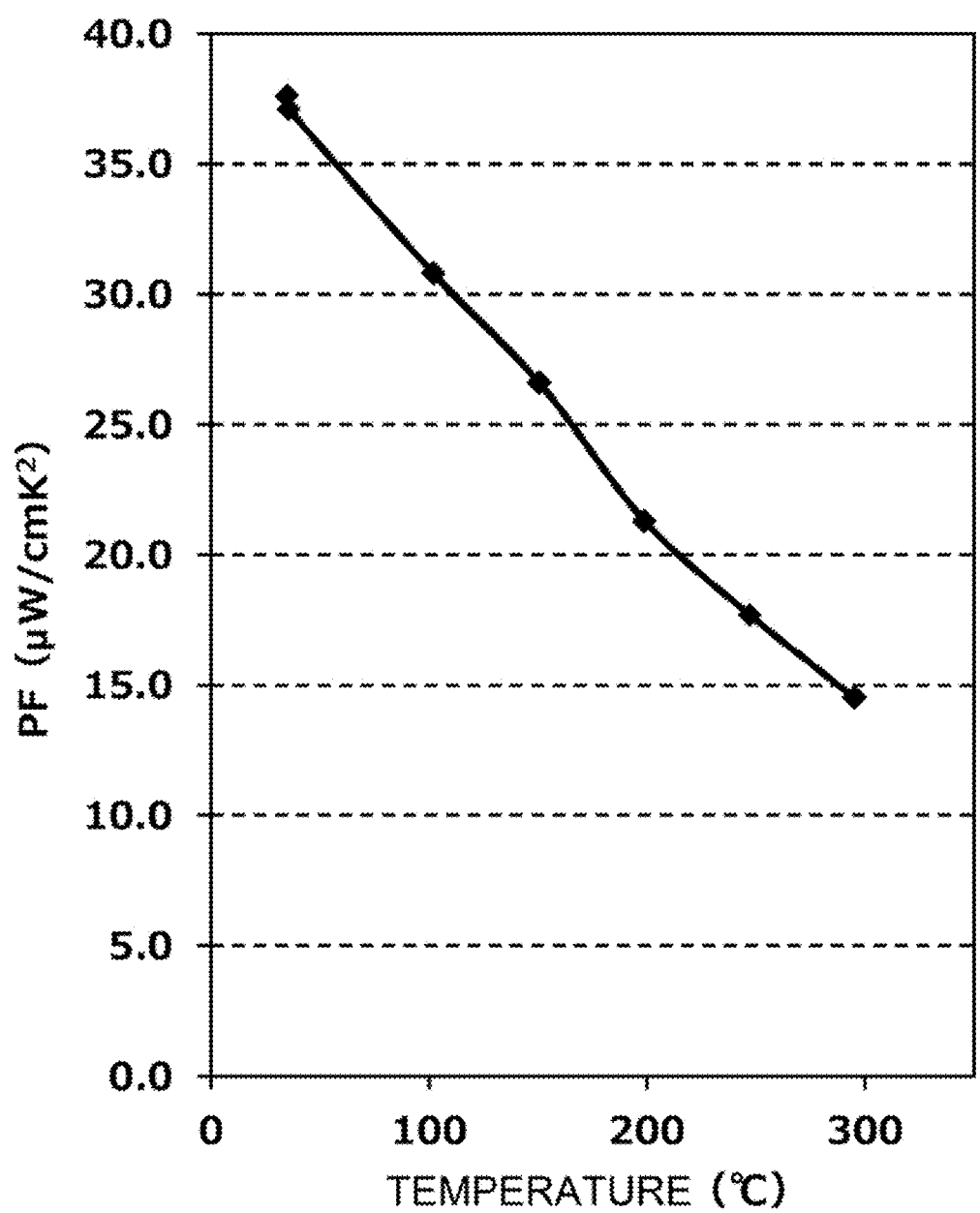
FIG. 8 is a diagram representing the PF of a bismuth-tellurium-based material as a function of temperature.

As shown, in FIG. 3, the materials of Examples 1 to 4 show stable power factors throughout the temperature range, and it can be said that the temperature dependence is small. In other words, these materials have desirable characteristics as thermoelectric conversion materials. This is described below in greater detail. A temperature difference occurs in the thermoelectric conversion material when, the material is used as a thermoelectric conversion module. For example, a temperature difference of 300° C. occurs when the lower temperature is 100° C., and the higher temperature is 400° C. Inside the material, property changes occur according to the temperature distribution. Specifically, properties expected from 100° C. occur in 100° C. portions, whereas 400° C. portions develop properties expected from a 400° C. temperature. Examples 1 to 4 of the present disclosure show high power factors in a temperature range near and above ordinary temperature, though PF tends to slightly decrease as the temperature increases. These materials are thus able to exhibit stable characteristics in the actual working environment. Particularly, PF remains almost the same from low temperature to high temperature in Examples 3 and 4. This is a great difference from the bismuth-tellurium material represented in FIG. 8. Basing on the principle of thermoelectric conversion phenomenon where a temperature difference is of importance, it can be said that the materials of Examples 1 to 4, specifically the skutterudite-type materials contained in the thermoelectric conversion material of the present disclosure have very high thermoelectric conversion performance.

Ga has smaller effects on electrical resistivity and Seebeck coefficient, than In, as described above. The following describes the effect of Ga on thermal conductivity as a characteristic feature of the embodiment of the present disclosure.

Figure 4:
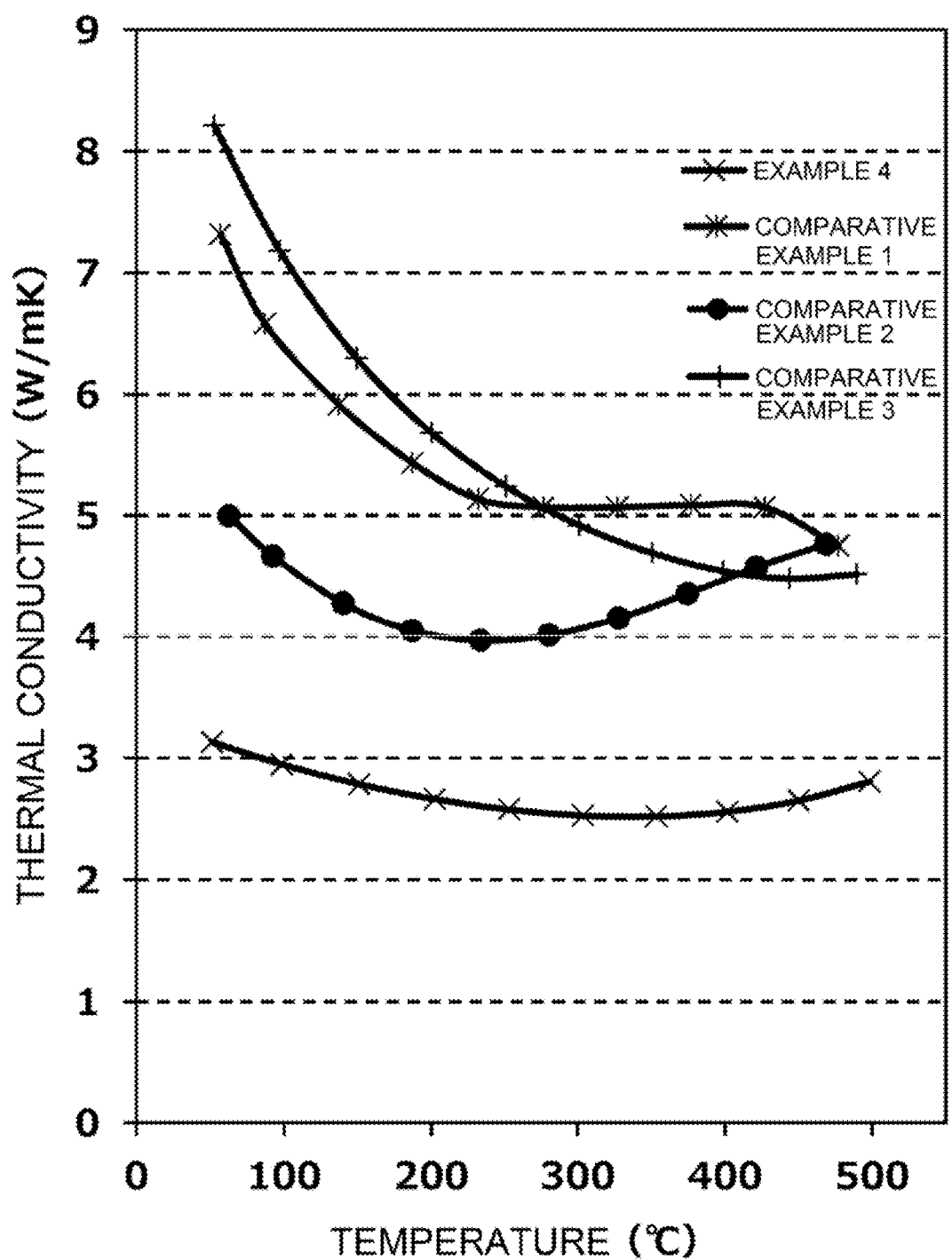
FIG. 4 is a diagram representing the thermal conductivity of skutterudite-type materials as a function of temperature according to an embodiment of the present disclosure.

FIG. 4 represents the thermal conductivity of the materials of Example 4 and Comparative Examples 1 to 3 as a function of temperature. In the graph of FIG. 4, the horizontal axis represents the measurement environment temperature (° C.), and the vertical axis represents thermal conductivity (W/mK). As shown in FIG. 4, the thermal conductivity is the lowest in the material of Example 4, and the second lowest in the material of Comparative Example 2. The thermal conductivity is about the same between the material of Comparative Example 1 and the material of Comparative Example 3. This is believed to the due to the result of the presence of Ga particles or Ga and In compound particles at the crystal interface of the skutterudite structure. The skutterudite-type material of the present disclosure has a higher atom concentration for Ga than for In. The reason for increasing Ga despite only a small effect it has on electrical characteristics is to exhibit the thermal conductivity effect. When Ga is added to $Co_4Sb_{12}$, excess Ga having no space in the crystal lattice precipitates as fine particles at the crystal interface. Precipitation of Ga at the crystal surface occurs not only as a simple substance but as an alloy with In or Sb. Sb precipitates on the surface in the form of an alloy as it replaces some of the Ga atoms, and enters the crystal lattice of the skutterudite. In particles that cannot find a space in the skutterudite also precipitate in the same fashion. Specifically, particles of at least Ga precipitate at the crystal interface.

Here, the lattice constant is different for crystals containing $Co_4Sb_{12}$, and crystals of particles containing Ga which precipitates on the surface (Ga crystals, or crystals of an alloy of Ga with In or Sb). This creates strain at the crystal interface. The strain effectively scatters phonons that cause heat conduction, and makes the thermal conductivity smaller. Referring to FIG. 4, the material of Comparative Example 2 shows the second lowest thermal conductivity after the material of Example 4 because of the thermal conductivity reducing effect of the Ga-containing crystals. The thermal conductivity tends to increase when Ga is not contained as in Comparative Examples 1 and 3, or when the Ga content is too small. The material of Example 4 shows a very low thermal conductivity because it contains a sufficient amount of In, and simultaneously develops the rattling effect. Not all In atoms enter the spaces in the skutterudite structure, and some of the added In atoms precipitate at the crystal interface as does Ga, or precipitate as alloy particles with Ga to develop the phonon scattering effect.

Figure 5:
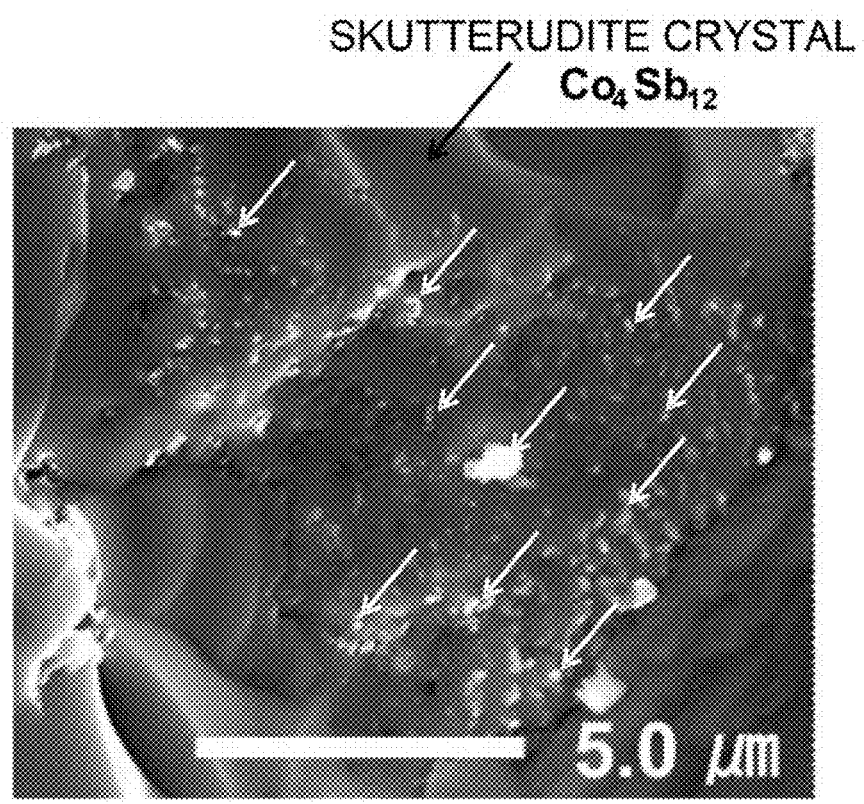
FIG. 5 shows an electron micrograph of the crystal interface of a skutterudite-type material according to an embodiment of the present disclosure.

FIG. 5 shows an electron micrograph of the crystal interface of the material of Example 4 ($In_{0.11}Ga_{0.34}Co_4Sb_{12}$). As shown in FIG. 5, precipitated Ga particles can be seen at the crystal surface, along with particles of Ga—In and Ga—Sb alloys. The numerous dots on the surface of the large $Co_4Sb_{12}$ crystals represent the particles, and some of the precipitated particles are indicated by arrowheads in FIG. 5. The crystals of the solid solution containing the Ga precipitates have an average particle size of not more than 1 μm and not less than 1 nm. Here, the average particle size of crystals is determined by calculating the diameters of corresponding circles having the same areas as crystals contained in captured two-dimensional image data of crystals. The average particle size is a calculated mean value of the corresponding diameters of at least 20 crystals contained in the same image data.

Figure 6:
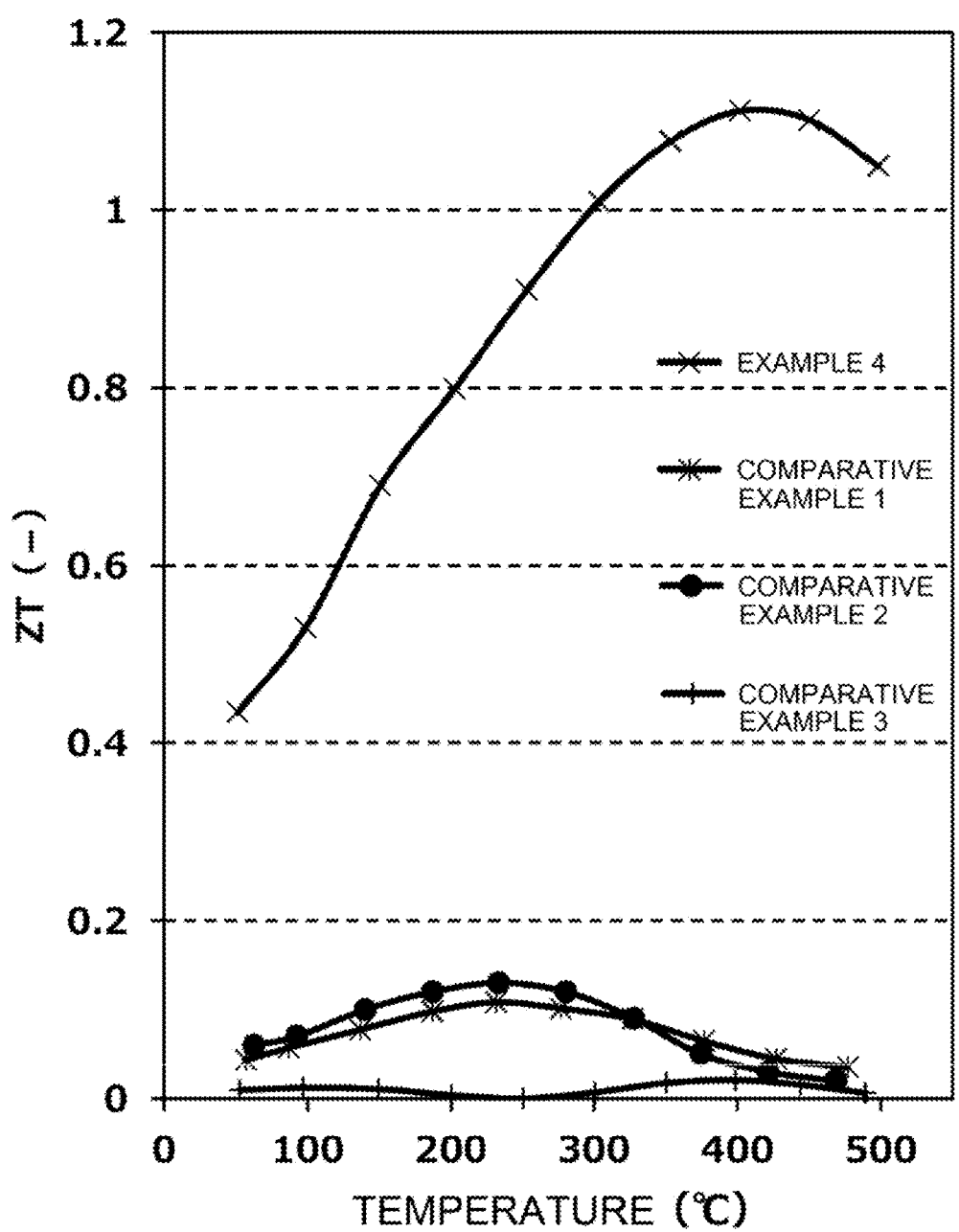
FIG. 6 is a diagram representing the dimensionless performance index of skutterudite-type materials as a function of temperature according to an embodiment of the present disclosure.

FIG. 6 represents the dimensioning performance index ZT of the materials of Example 4 and Comparative Examples 1 to 3 as a function of temperature. In the graph of FIG. 6, the horizontal axis represents the measurement environment temperature, and the vertical axis represents ZT. As shown in FIG. 6, the material of Example 4 has the highest ZT. Specifically, the power factor PF, and the dimensionless performance index ST are high in the material of Example 4, and this material should produce a large amount of electricity.

In the embodiment of the present disclosure, a thermoelectric conversion material of the same characteristics obtained in Example 4 can be obtained when the material satisfies the composition formula (II).

The thermoelectric conversion material of the present disclosure may additionally contain other materials, as required, as long as the skutterudite-type material is contained as a main material. As used herein, "skutterudite-type material contained as a main material" means that the skutterudite-type material is more than 50 mass % of the total mass of the thermoelectric conversion material.

Thermoelectric Conversion Material Producing Method

A method for producing the thermoelectric conversion material of the embodiment of the present disclosure is described below. The thermoelectric conversion material of the embodiment of the present disclosure can be produced by charging a mixture of In, Ga, Co, and Sb into a container, heating the container and melting the mixture at a first temperature, quenching the molten mixture to form a solid, and heating the solid in a heat treatment at a second temperature lower than the first temperature to obtain a skutterudite-type material of the desired composition formula. The following descriptions of the producing method are based on the material of Example 4 ($In_{0.11}Ga_{0.34}Co_4Sb_{12}$). However, the materials of Examples 1 to 3, and materials of the composition formula (I) containing different elements also may be produced in the same manner by adjusting the materials or the mixture ratio.

Simple substance metals In, Ga, Co, and Sb are used as starting materials. The pure metals In, Ga, Co, and Sb are charged into a quartz tube in a weight ratio In:Ga:Co:Sb of 0.401:1:17.75:40.08. Here, the calculation of the weight ratio of In, Ga, Co, and Sb is based on specific gravities 7.31, 5.9, 8.9, and 6.7, respectively. Preferably, the quartz tube is filled with an inert gas such as argon, or a vacuum is created inside the quarts tube to prevent oxidation of the materials. It is also preferable to keep the quartz tube highly airtight to prevent entry of oxygen into the quartz tube after charging the materials. The container used to contain the material mixture is not limited to the quartz tube, and any container may be used, as long as it can be kept airtight. For example, a metallic container may be used.

The quartz tube with the sealed mixture is heated with an electric furnace at a temperature (first temperature) between 1,050° C. and 1,300° C. In the embodiment of the present disclosure, the ratio of Co to Sb is 1:3 in terms of an atomic concentration, and the alloy has a melting point in the vicinity of about 1,000° C. Accordingly, the heating temperature (first temperature) is set at or above this melting point. Considering the heat resistance of the container, and the vaporization of metal, the heating temperature is set so that the maximum heating temperature does not become excessively high. The heating time is not particularly limited, as long as an alloy of Co and Sb can be formed.

The heated molten mixture is cooled into a solid. The method of cooling the mixture is not particularly limited. However, it is preferable to quench the mixture, for example, by dipping the mixture inside the quartz tube in water bath. Here, the starting simple substance metals have mixed and formed an alloy after being heated as above. It is known that the crystal grain size varies as the molten metal cooling rate increases, irrespective of the thermoelectric conversion material. The particle size of the solid can thus be reduced by quenching the mixture. By reducing the particle size of the solid, it becomes easier to obtain a thermoelectric conversion material having a skutterudite-type crystalline structure, as will be described later.

The solid is then subjected to a heat treatment at a temperature (second temperature) below the first temperature. Specifically, the solid is heated at a temperature (second temperature), between 500° C. and 800° C., using the same electric furnace used to melt the mixture. Here, the solid may be heated inside or outside of the quartz tube. When heating the solid outside of the quartz tube, the electric furnace is filled with an inert gas, or a vacuum atmosphere is created therein, to prevent the mixture from being oxidized.

The solid before the heat treatment at the second temperature is not in a state of skutterudite-type crystals, and In and Ga exist as a mixture with metals such as $CoSb_2$ and Sb. In other words, the solid does not have the thermoelectric conversion material characteristics in this state. Heating at the second temperature reconstitutes the mixture into a crystal form, and creates the desired skutterudite structure. Preferably, the crystal grains of metals such as $CoSb_2$ and Sb are finely dispersed before the heat treatment at the second temperature. Heating at the second temperature is performed in a solid state. It is accordingly difficult to form skutterudite-type crystals when Sb is segregated as large crystal grains, and reacts with, for example, $CoSb_2$. Because the mixture does not melt at the second temperature, the atoms are not fluidic, and move inside the crystals by diffusion. A structural change to skutterudite-type crystals thus becomes more likely, and it takes place more uniformly when the solid before the heat treatment is a fine solid.

The heat treatment time at the second temperature may be, for example, 10 hours to 168 hours, though it depends on the state of crystal grain size. As a rule, a thermoelectric conversion material of stable characteristics can be obtained when the heat treatment is performed for a longer time period.

Figure 7:
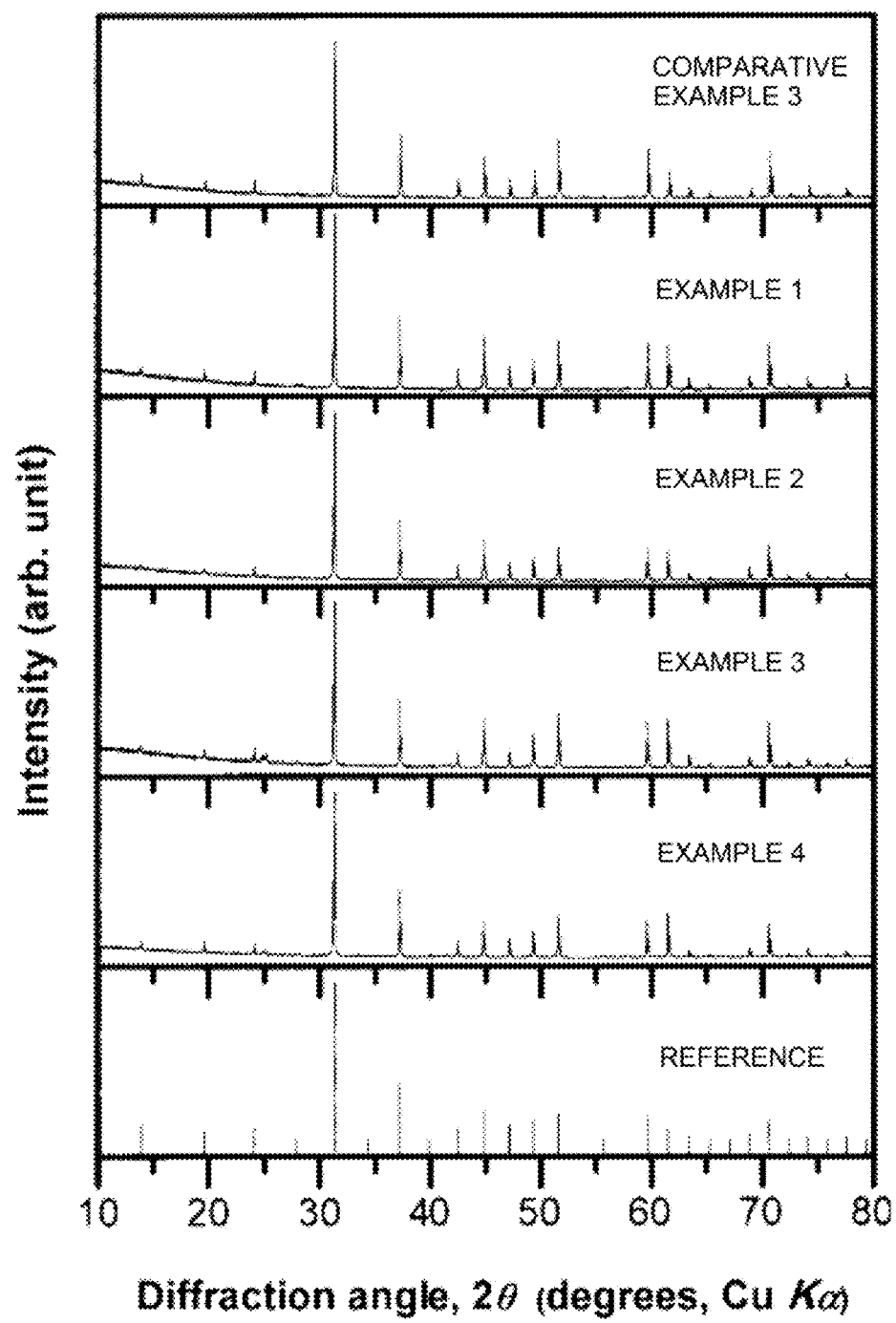
FIG. 7 is a diagram representing X-ray diffraction spectra of skutterudite-type materials according to an embodiment of the present disclosure.

The thermoelectric conversion material having thermoelectric conversion characteristics of the embodiment of the present disclosure can be obtained after these steps. FIG. 7 shows X-ray diffraction (XRD) patterns of the materials of Examples 1 to 4 and Comparative Example 3 obtained by using the method described above. The spectrum at the bottom of FIG. 7 is a $CoSb_3$ reference pattern. The skutterudite-type crystals are more ideal as the peak is closer to the reference. As can be seen in FIG. 7, the materials of Examples 1 to 4 have clear skutterudite phase peaks, and there is hardly any impurity. A skutterudite phase is also observed in the materials of Comparative Example 3, as in the materials of Examples 1 to 4. However, the thermoelectric characteristics are not desirable because of the small proportions of In and Ga.

The thermoelectric conversion material of the embodiment of the present disclosure may have a powder form, and may be subjected to sinter molding. The material may be remelted, molded into a specified shape by being drawn into a glass tube or the like, and mounted on a substrate after being separated into individual pieces. A practical thermoelectric conversion module can be obtained by molding the material into a desired shape in this fashion.

Although the present disclosure has been described with reference to the aforementioned embodiments, this description is not meant to be construed in a limiting sense. Various modifications of the disclosed embodiments as well as alternative embodiments of the invention will become apparent, to persons skilled in the art. It is therefore contemplated that the appended claims will cover any such modifications or embodiments.

INDUSTRIAL APPLICABILITY

The thermoelectric conversion material according to the embodiment of the present disclosure has more desirable thermoelectric conversion characteristics than thermoelectric conversion materials of related art, and is applicable for recovery of high-temperature energy such as, for example, in automobiles, in recovery of exhaust heat in factories, . . . etc.

What is claimed is:

1. A thermoelectric conversion material comprising a skutterudite-type material represented by the following composition formula (I)

$$In_xGa_yM_4Pn_{12} \quad (I),$$

wherein:
x and y satisfy $0.04 \leq x \leq 0.11,$ $0.11 \leq y \leq 0.34,$ and $x < y,$ M represents one or more elements selected from a group of elements including: Co, Rh, Ir, Fe, Ni, Pt, Pd, Ru, and Os, and Pn represents one or more elements selected from a group of elements including: Sb, As, P, Te, Sn, Bi, Ge, Se, and Si.

2. The thermoelectric conversion material according to claim 1, wherein M is Co, and Pn is Sb in the composition formula (I).

3. The thermoelectric conversion material according to claim 2, which further comprises particles containing at least Ga, and having an average particle size of not more than 1 mm and not less than 1 nm.

4. A method for producing a thermoelectric conversion material containing a skutterudite-type material represented by the following composition formula (I)

$$In_xGa_yM_4Pn_{12} \quad (I),$$

wherein:
x and y satisfy $0.04 \leq x \leq 0.11,$ $0.11 \leq y \leq 0.34,$ and $x < y,$ M represents one or more elements selected from a group of elements including: Co, Rh, Ir, Fe, Ni, Pt, Pd, Ru, and Os, and Pn represents one or more elements selected from a group of elements including: Sb, As, P, Te, Sn, Bi, Ge, Se, and Si, the method comprising:

charging a mixture of the elements represented by M, and Pn, and In and Ga of the composition formula (I) into a container;

heating the container, and melting the mixture at a first temperature to obtain a molten mixture;

quenching the molten mixture to form a solid; and heating the solid in a heat treatment at a second temperature lower than the first temperature to obtain the skutterudite-type material represented by the composition formula (I).

5. The method according to claim 4, wherein M is Co, and Pn is Sb in the composition formula (I).

6. The method according to claim 5, which further comprises particles containing at least Ga, and having an average particle size of not more than 1 mm and not less than 1 nm.

* * * * *